(12) United States Patent
Zeng et al.

(10) Patent No.: US 9,269,698 B2
(45) Date of Patent: Feb. 23, 2016

(54) ALTERNATING CURRENT VERTICAL LIGHT EMITTING ELEMENT AND MANUFACTURING METHOD THEREOF

(71) Applicant: Xiamen Sanan Optoelectronics Technology Co., Ltd., Xiamen (CH)

(72) Inventors: Xiaoqiang Zeng, Xiamen (CN); Shunping Chen, Xiamen (CN); Shaohua Huang, Xiamen (CN); Qunfeng Pan, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/358,190

(22) PCT Filed: Dec. 21, 2012

(86) PCT No.: PCT/CN2012/087139
§ 371 (c)(1),
(2) Date: May 14, 2014

(87) PCT Pub. No.: WO2013/097651
PCT Pub. Date: Jul. 4, 2013

(65) Prior Publication Data
US 2014/0291708 A1   Oct. 2, 2014

(30) Foreign Application Priority Data

Dec. 28, 2011   (CN) .......................... 2011 1 0447160

(51) Int. Cl.
*H01L 29/18*   (2006.01)
*H01L 21/00*   (2006.01)
(Continued)

(52) U.S. Cl.
CPC ............ *H01L 25/0753* (2013.01); *H01L 25/50* (2013.01); *H01L 27/156* (2013.01); *H01L 33/0079* (2013.01); *H01L 33/38* (2013.01); *H01L 2924/0002* (2013.01)

(58) Field of Classification Search
CPC ... H01L 25/0753; H01L 25/50; H01L 27/156; H01L 33/0079; H01L 33/38; H01L 2924/0002
USPC .............................................. 257/88; 438/28
See application file for complete search history.

(56) References Cited

U.S. PATENT DOCUMENTS

| 7,473,934 B2 * | 1/2009 | Nagai et al. ..................... 257/89 |
| 2008/0303041 A1 * | 12/2008 | Lai ................................. 257/89 |

(Continued)

FOREIGN PATENT DOCUMENTS

| CN | 1602569 | 3/2005 |
| CN | 101015069 A | 8/2007 |

(Continued)

OTHER PUBLICATIONS

International Search Report for PCT/CN2012/087139, Date of mailing: Mar. 21, 2013, entitled: "Alternating Current Vertical Light Emitting Element and Manufacturing Method Thereof".

*Primary Examiner* — Fernando L Toledo
*Assistant Examiner* — Neil Prasad
(74) *Attorney, Agent, or Firm* — Syncoda LLC; Feng Ma (57) ABSTRACT

This invention discloses an AC-type vertical light emitting element and fabrication method thereof, which achieves polarity reversal of two LEDs via regional laser stripping and die bonding. The two LEDs are placed on a conductive substrate (e.g. Si substrate); therefore, the bonding pads of the two LEDs are on the back of the conductive substrate and the light emitting surfaces of the two LEDs, thus overcoming such problems of low light emitting efficiency and high thermal resistance of the traditional lateral structure.

20 Claims, 12 Drawing Sheets

(51) Int. Cl.
*H01L 25/075* (2006.01)
*H01L 25/00* (2006.01)
*H01L 27/15* (2006.01)
*H01L 33/00* (2010.01)
*H01L 33/38* (2010.01)

(56) References Cited

U.S. PATENT DOCUMENTS

2009/0261357 A1* 10/2009 Daniels .......................... 257/88
2009/0267085 A1* 10/2009 Lee et al. ....................... 257/88
2009/0272991 A1* 11/2009 Lee et al. ....................... 257/91
2011/0297972 A1* 12/2011 Seo et al. ....................... 257/88

FOREIGN PATENT DOCUMENTS

| | | |
|---|---|---|
| CN | 101144598 A | 3/2008 |
| CN | 101740557 A | 6/2010 |
| CN | 102509731 | 6/2012 |
| JP | 11-17340 | 1/1999 |

* cited by examiner

ALTERNATING CURRENT VERTICAL LIGHT EMITTING ELEMENT AND MANUFACTURING METHOD THEREOF

This application is the U.S. National Stage of International Application No. PCT/CN2012/087139, filed Dec. 21, 2012, which designates the U.S., published in Chinese, and claims priority under 35 U.S.C. §119 or 365(c) to Chinese Patent Application No. 201110447160.7, filed Dec. 28, 2011. The entire teachings of the above applications are incorporated herein by reference.

FIELD OF THE INVENTION

The present invention relates to a semiconductor light emitting element and fabrication method thereof, more particularly, to an AC-type vertical light emitting element and fabrication method.

BACKGROUND OF THE INVENTION

Light emitting diode (LED) is a kind of semiconductor diode that can transfer electric energy into light energy and emits visible light in yellow, green, blue and the like as well as infrared and ultraviolet invisible light. LED is characterized by low working voltage and current, high reliability, long service life and ease of luminance regulation, etc.

The traditional LED chip is driven by the direct current (DC). Therefore, to ensure normal operation of the LED, a rectifier transformer is required for AC/DC transformation when the supply power is alternating current (AC). In addition, power saving performance is of great importance to LED applications. However, the traditional LED's efficiency is still unsatisfactory since AC/DC transformation may consume as high as 15%-30% power; under this background, an LED directly driven by AC comes into being.

Figure 1:
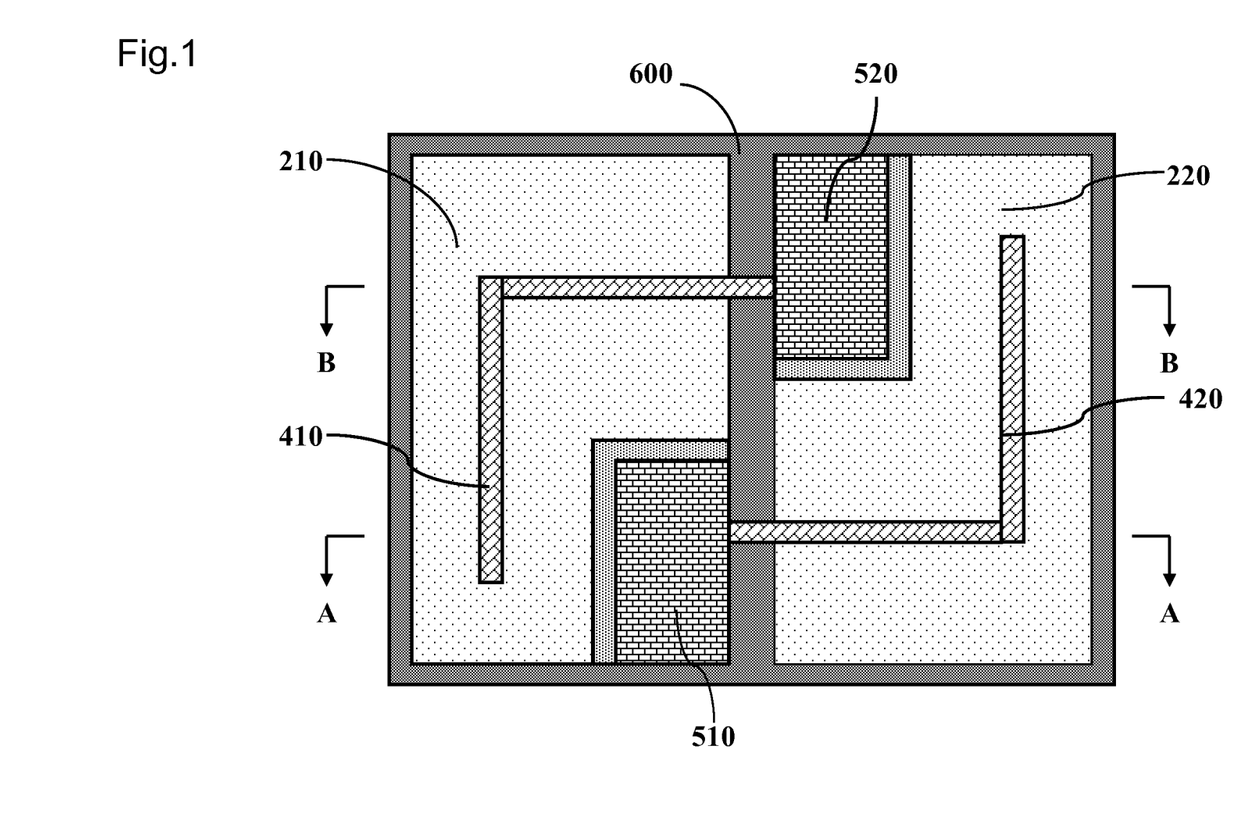
FIG. 1 is a front top view of an AC-type lateral light emitting element.
Figure 2:
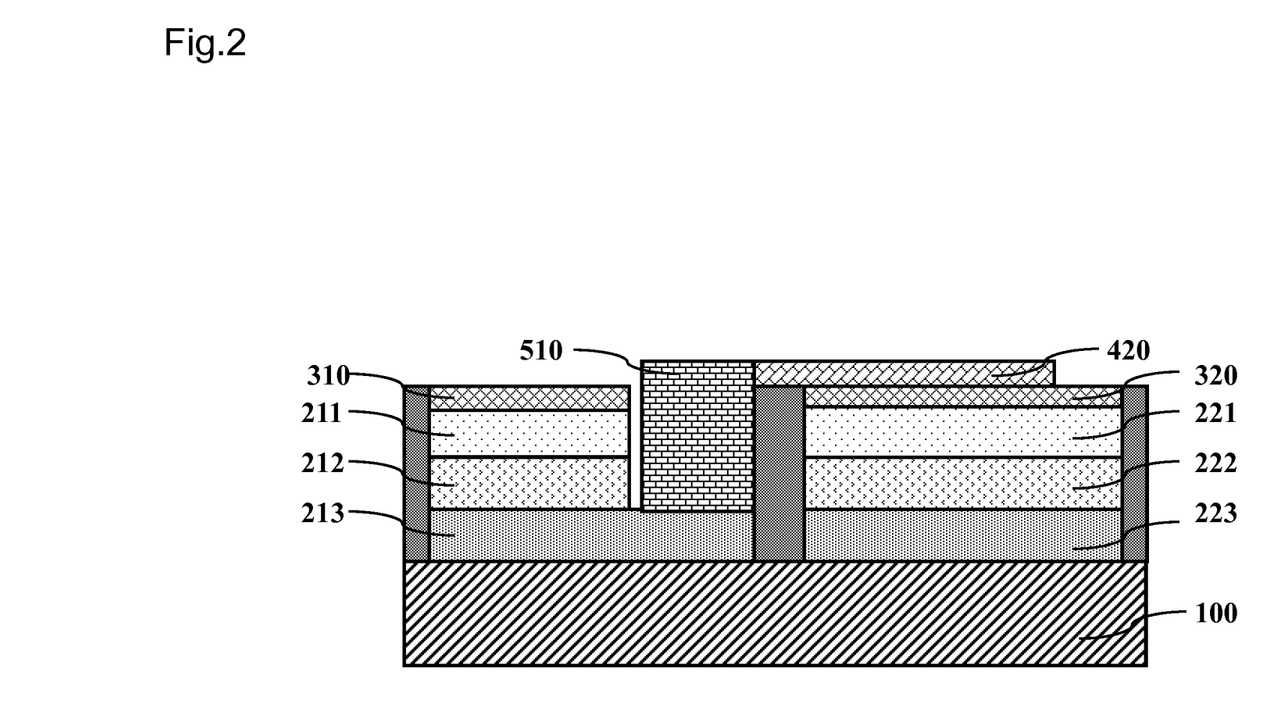
FIG. 2 is a schematic sectional view cut along the Line A-A indicated by the arrow in FIG. 1.
Figure 3:
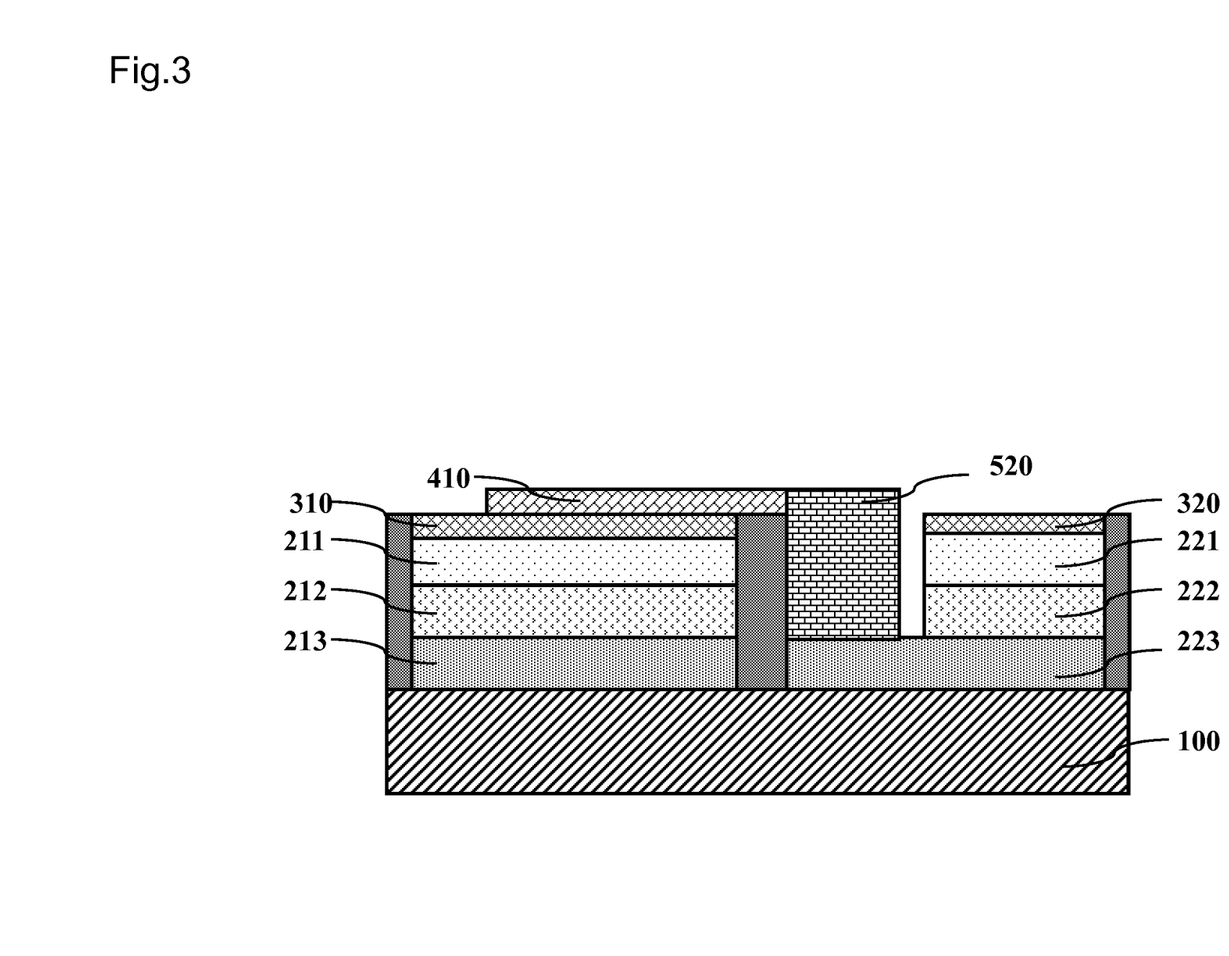
FIG. 3 is a schematic sectional view cut along the Line B-B indicated by the arrow in FIG. 1.

FIGS. 1-3 show a current AC-type LED. According to FIGS. 1-3, two LED units 210 and 220 are arranged on a substrate in the same direction. Strip-current extended electrodes 410 and 420 and a bonding pad connect an n-type layer of a first LED unit 210 to a p-type layer of a second LED unit 220 and connect a p-type layer of the first LED unit 210 to an n-type layer of the second LED unit 220, thus constituting an AC-type light emitting element. However, the single LED unit of the AC light emitting element has a lateral structure, while the lateral structure LED chip cannot be driven by high current density owing to low light emitting efficiency, current blockage, high thermal resistance, etc.

SUMMARY OF THE INVENTION

To solve the above problems of the prior art, this invention discloses an AC-type vertical light emitting element and fabrication method thereof, which achieves polarity reversal of two LEDs via regional laser stripping and die bonding. The two LEDs are placed on a conductive substrate; therefore, the bonding pads thereof are on the back of the conductive substrate and light emitting surfaces of the two LEDs, thus overcoming such problems of low light emitting efficiency and high thermal resistance of the traditional lateral structure.

According to a first aspect of this invention, an AC-type vertical light emitting element comprises a conductive substrate including a front main surface and a back main surface; an AC light emitting module having two reversely-arranged LEDs that forms on the front main surface of the first substrate, in which, a first LED comprises a p-type semiconductor, an active area and an n-type semiconductor layer from top down, and a second LED comprises an n-type semiconductor layer, an active area and a p-type semiconductor layer from top down; a conductive structure that connects the n-type semiconductor layer of the first LED to the p-type semiconductor layer of the second LED; and a bonding pad that connects the p-type semiconductor layer of the first LED to the n-type semiconductor layer of the second LED.

Further, an isolating area made of insulating material is formed between the first and the second light emitting epitaxial layers, on which the bonding pad is arranged.

Further, the AC-type vertical light emitting element also comprises a metal contact layer that forms on the back surface of the substrate.

Further, the AC-type light emitting element also comprises a strip extended electrode that distributes on the top surface of the AC light emitting module and connects to the bonding pad.

Further, under forward overlooking, the first bonding pad and the strip extended electrode only cover 0%-5% of the active area.

According to a second aspect of this invention, an AC-type vertical light emitting element comprises a conductive substrate including a front main surface and a back main surface; an AC light emitting module having two reversely-arranged LEDs that forms on the front main surface of the first substrate, in which a first LED comprises a p-type layer, an active area and an n-type layer from top down, and a second LED comprises an n-type layer, an active area and a p-type layer from top down; an insulating material filled between the two LEDs, the height of which is parallel to or a little higher than the surfaces of the two LEDs; a transparent conductive layer that forms on the p-type layer of the first LED and the n-type layer of the second LED; a strip extended electrode that forms on the transparent conductive layer; a conductive structure that connects the n-type layer of the first LED to the p-type layer of the second LED; and a first bonding pad that forms on the insulating materials between the two LEDs, which connects the p-type layer of the first LED to the n-type layer of the second LED; under forward overlooking, the first bonding pad and the strip extended electrode only cover 0%-5% of the active area.

According to a third aspect of this invention, a fabrication method of the AC-type vertical light emitting element includes the following steps: 1) providing a growth substrate, on which a light emitting epitaxial layer forms via epitaxial growth, which at least comprises an n-type layer, an active layer and a p-type layer from bottom up; 2) defining the size of a single LED and dividing the light emitting epitaxial layer into two LED series; 3) providing a permanent conductive substrate and transferring the first LED series to the permanent substrate, making the n-type layer as the light-emitting surface and connecting the p-type layer to the permanent substrate; 4) transferring the second LED series to the permanent substrate via second substrate transfer and making the second LED series arranged on the permanent substrate reversal to the first LED series; making the p-type layer as the light-emitting surface and connecting the n-type layer to the permanent substrate; 5) dividing the above LED series and forming AC-type vertical light emitting modules, each comprising an LED unit of the first LED series and an LED unit of the second LED series, and forming an isolating area between the two LED units; 6) forming a conductive structure in the isolating area, thus connecting the n-type layer of the first LED unit to the p-type layer of the second LED unit; and 7) forming a metal contact layer on the back of the permanent substrate to form an AC-type vertical light emitting element.

Further, in the step 2), each LED unit of the first series at least has a unit of the second series adjacent to it.

Further, in the step 3), the first LED series is lifted off from the growth substrate via LLO.

Further, in the step 3), the permanent substrate at least comprises an LED unit of the first LED series.

Further, in the step 3), the permanent substrate at least comprises two LED units of the first LED series, and the space between the two adjacent LED units is larger than the size of a single LED.

Further, the step 4) includes the following steps: providing a temporary substrate and bonding the second LED series with this substrate; removing the growth substrate; bonding the second LED series with the permanent substrate again; and removing the temporary substrate.

This invention solves the problems like current blockage and high thermal resistance of the prior lateral AC LED via the vertical structure. In addition, two LED chips reversely arranged on the conductive substrate make connecting easier and stability higher than the traditional AC-structural chip; without mesa etching, the light emitting area is also increased. The pad above the isolating area eliminates light blocking and improves light emitting and luminance.

Other features and advantages of the invention will be set forth in the description that follows, and in part will be obvious from the description, or be learned through implementation of the invention. The objectives and other advantages of the present invention can be realized and attained by the description, the claims and structures particularly pointed out in the drawings.

BRIEF DESCRIPTION OF THE DRAWINGS

The attached drawings help further understand this invention and constitute a part of the description. Together with the embodiments of the invention, these drawings are used for explaining the invention, but do not constitute a limitation to the invention. In addition, data on the attached drawings are just to describe an outline of the invention rather than being drawn in proportion.

In the figure, 100: insulating substrate; 101: conductive substrate; 102: temporary substrate; 210: an LED unit of the first LED series; 220: an LED unit of the second LED series; 201, 211, 221: p-type gallium nitride-based epitaxial layer; 202, 212, 222: active layer; 203, 213, 223: n-type gallium nitride-based epitaxial layer; 310, 320: transparent conductive layer; 410, 420: strip extended electrode; 510, 531: first bonding pad; 520: second bonding pad; 532: back electrode; 600: insulating area; A: the first LED series; B: the second LED series.

SPECIFIC EMBODIMENTS

Now, the embodiments of the present invention will be described in detail by referring to the following figures to ensure that the application of technical means of the present invention to solve technical problems and the process for achieving the technical effects can be fully understood and implemented accordingly. It should be noted that in case of no discrepancies, the embodiments of the invention and each feature of the embodiment can be combined with each other and those are all within the protection scope of the invention.

Embodiments

Figure 4:
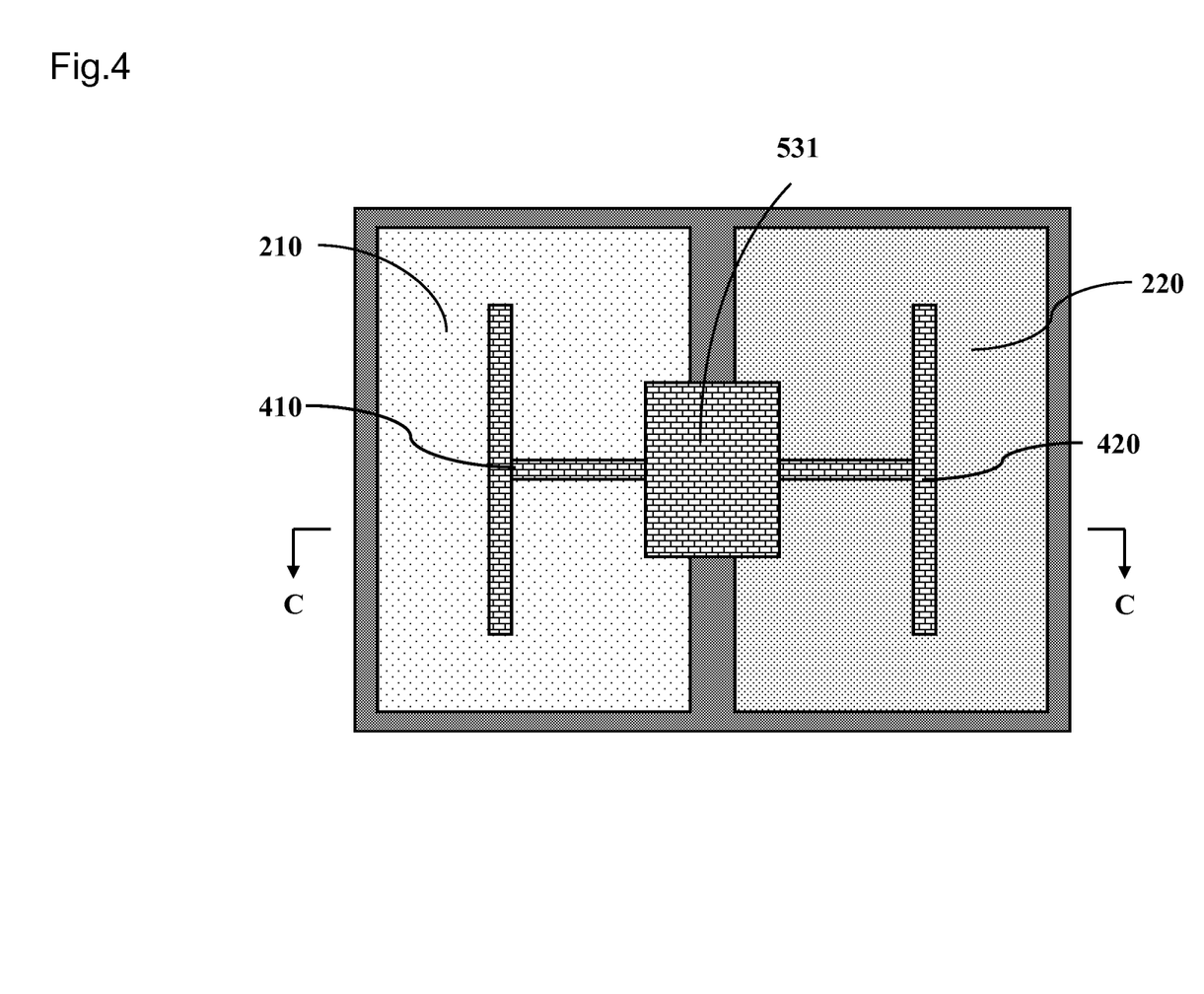
FIG. 4 is a front top view of an AC-type vertical light emitting element of the preferred embodiment of this invention.
Figure 5:
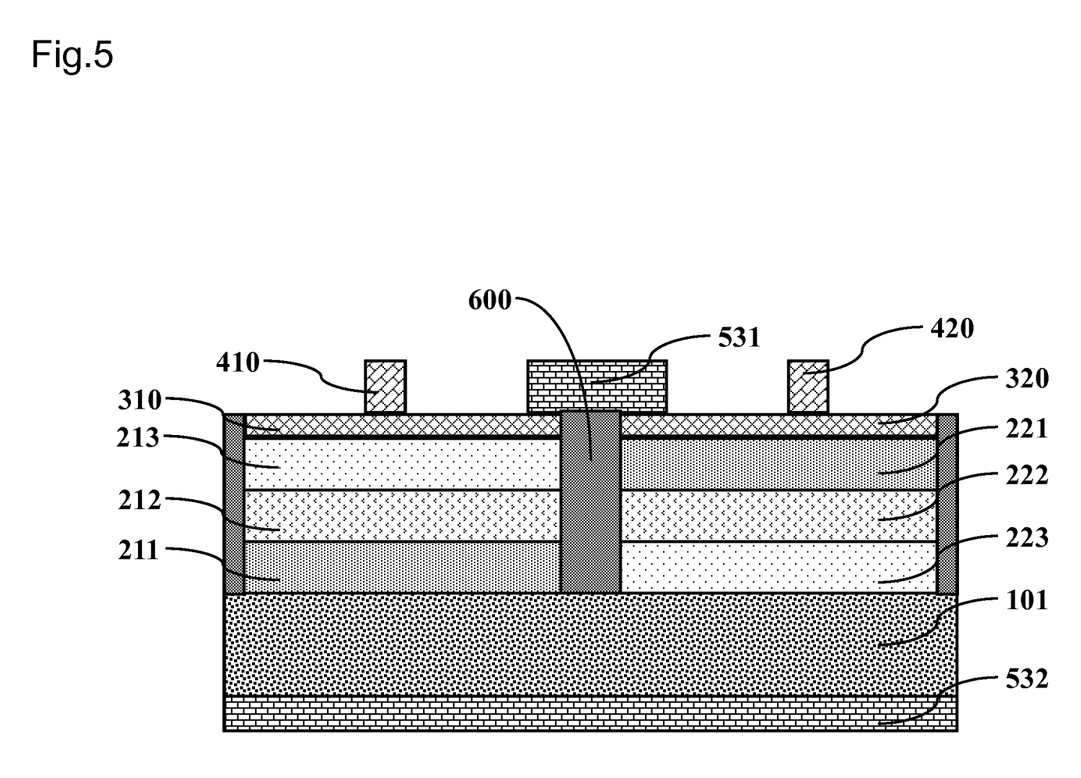
FIG. 5 is a sectional structure view of an AC-type vertical light emitting element of the preferred embodiment of this invention.

According to FIGS. 4-5, an AC-type vertical light emitting element comprises a conductive substrate 101, an AC light emitting module, transparent conductive layers 310 and 320, strip extended electrodes 410 and 420, a first bonding pad 531 and a back electrode 532. The AC light emitting module is composed of two polarity reversal LED units 210 and 220 arranged on the conductive substrate, among which is arranged an insulating area 600. The first LED 210 comprises an n-type semiconductor layer 213, an active layer 212 and a p-type semiconductor layer 211 from top down and the second LED 220 comprises a p-type semiconductor layer 221, an active layer 222 and an n-type semiconductor 223 from top down. The AC luminous module is on the conductive substrate 101 and the two are connected by a metal bonding layer (not shown in the figure). To achieve a better light emitting effect, a reflector can be arranged between the two. The transparent conductive layers 310 and 320 cover the front surface of the AC light emitting module. The strip extended electrodes 410 and 420 are distributed on the transparent conductive layers 310 and 320. The first bonding pad 531 is in the insulating area and connects to the strip extended electrodes 410 and 420, thus connecting the n-type layer 213 of the first LED 210 to the p-type layer 221 of the second LED 220. Under forward overlooking, the first bonding pad 531 and the strip extended electrodes 410 and 420 only cover 0%-5% of the active area. A back electrode 532 forms on the back of the conductive substrate.

According to FIGS. 6-12, a fabrication method of the AC-type vertical light emitting element includes the following steps.

Figure 6:
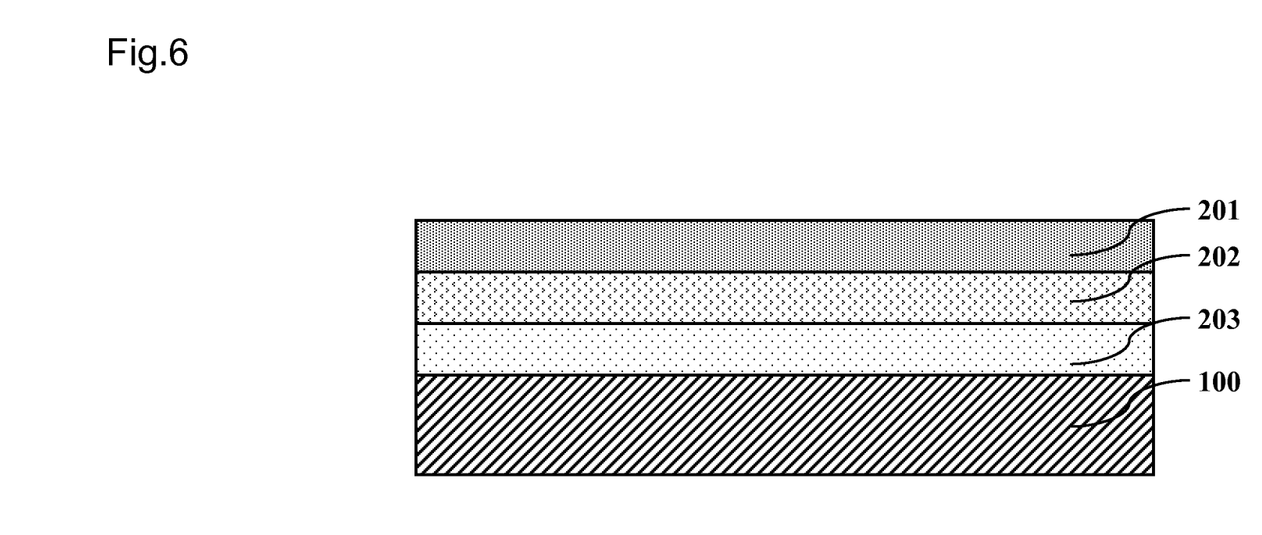
FIGS. 6-12 are sectional views of a fabrication process of the AC-type vertical light emitting element in the embodiment of this invention.

According to FIG. 6, grow an n-type semiconductor layer 203, a light emitting layer 202 and a p-type semiconductor layer 201 successively on an insulating substrate 100 (e.g. sapphire) via MOCVD.

Figure 7:
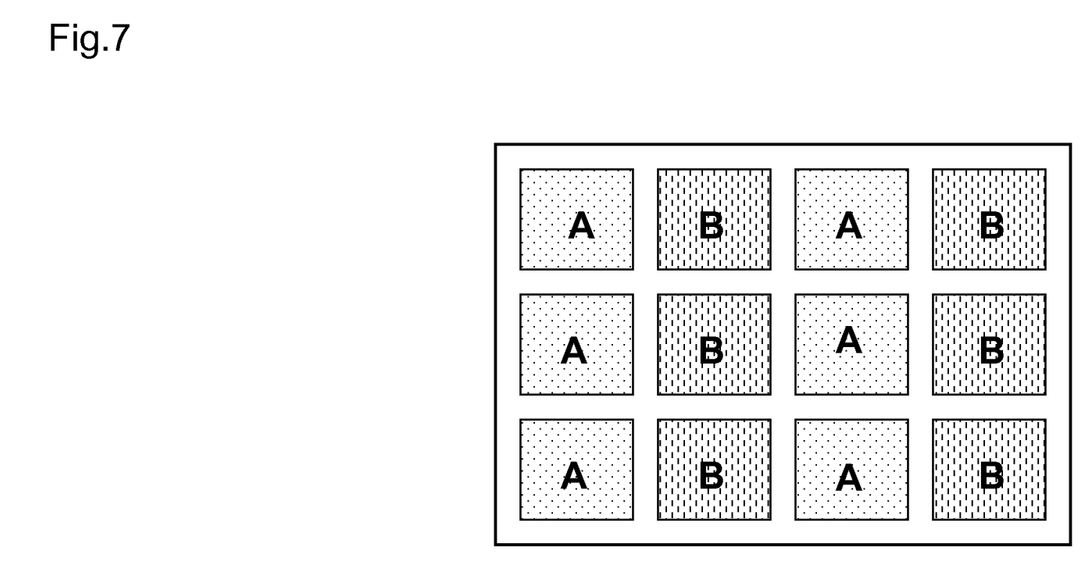
Figure 8:
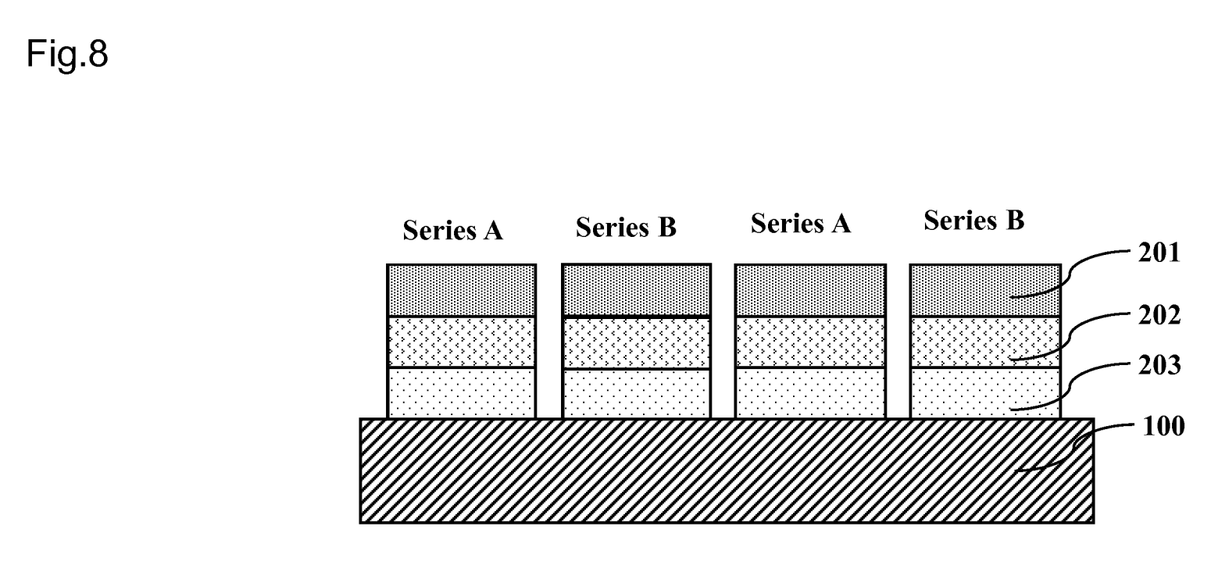

Further, define the size of a single LED and divide the light emitting epitaxial layer into two LED series A and B. The top view is shown in FIG. 7. More particularly, firstly define the size of a single LED and pattern the light emitting epitaxial layer via mask. Punch through the epitaxial layer via the ICP dry etching to expose the insulating substrate and generate an isolating area. Divide the light emitting epitaxial layer into at least two LED series A and B, i.e., the first LED and the second LED. Each LED series at least comprises an LED unit, the sectional structure of which is shown in FIG. 8.

Figure 9:
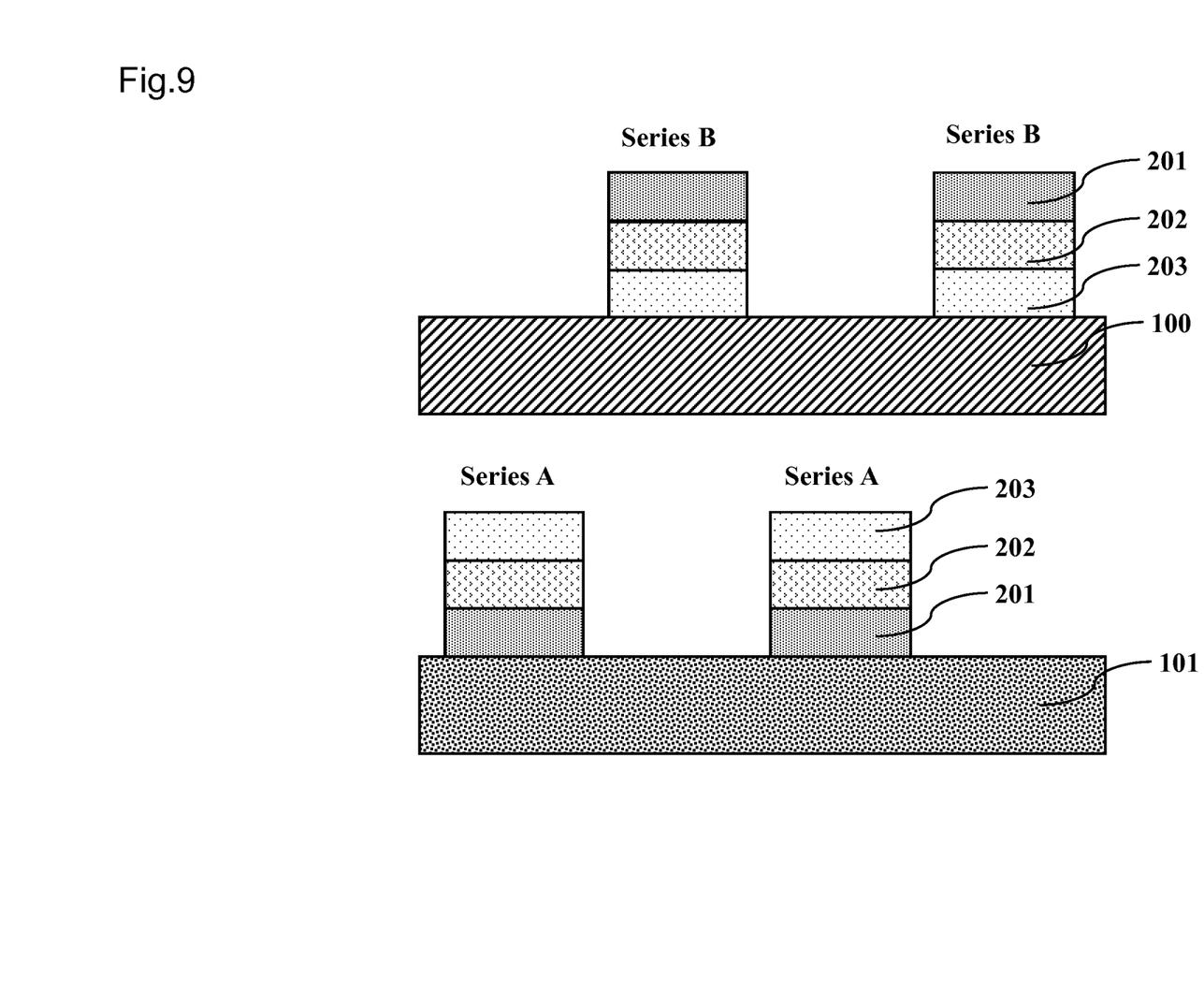
Figure 10:
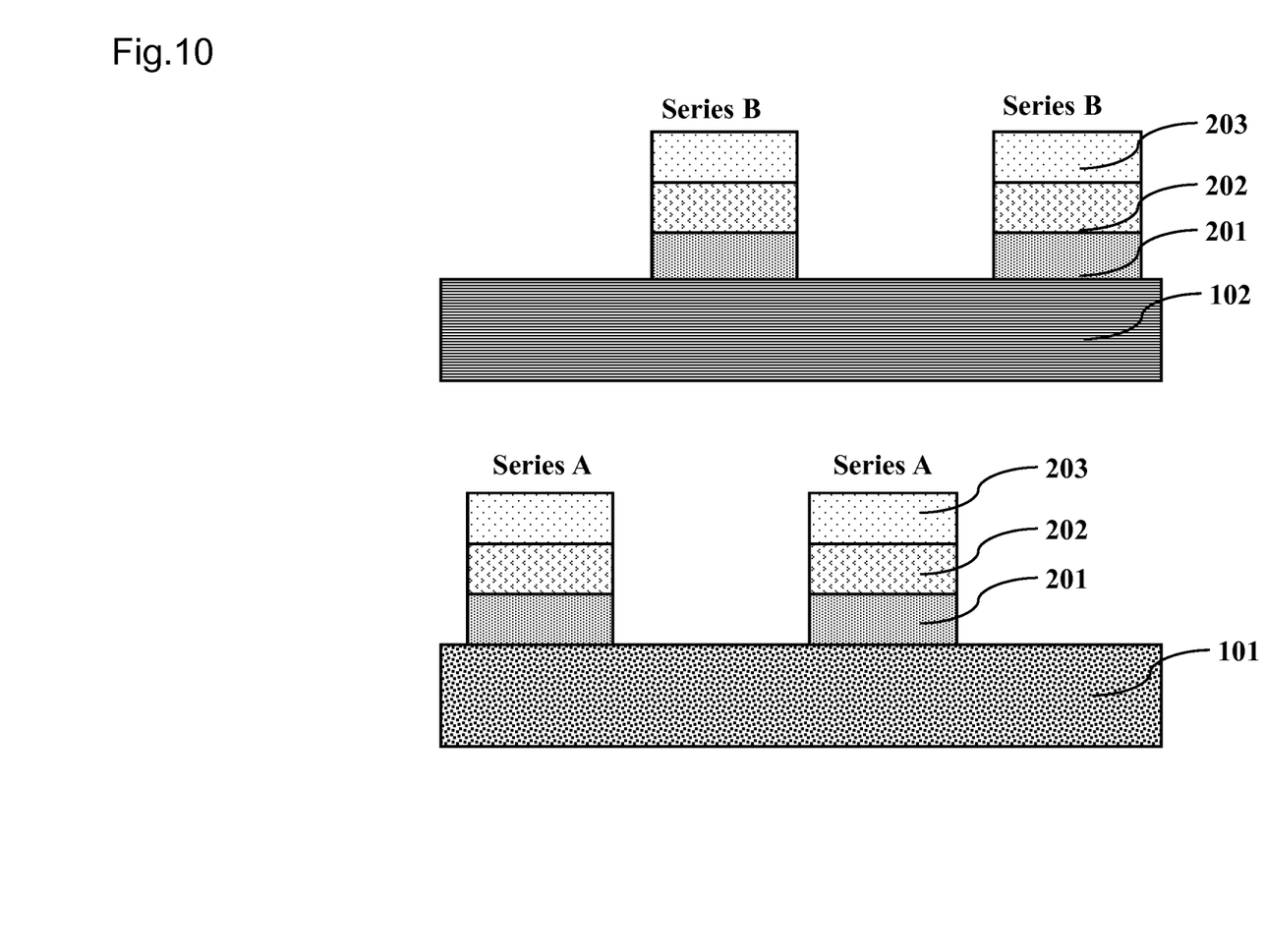
Figure 11:
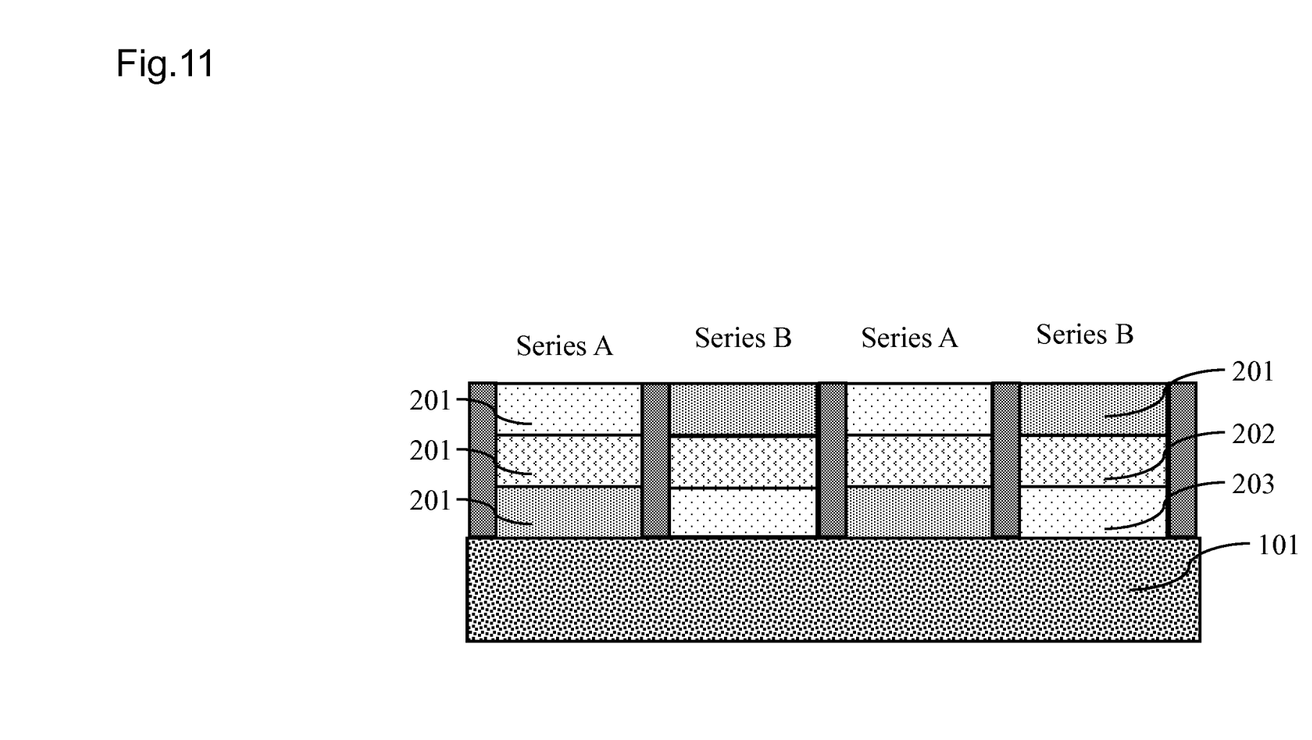
Figure 12:
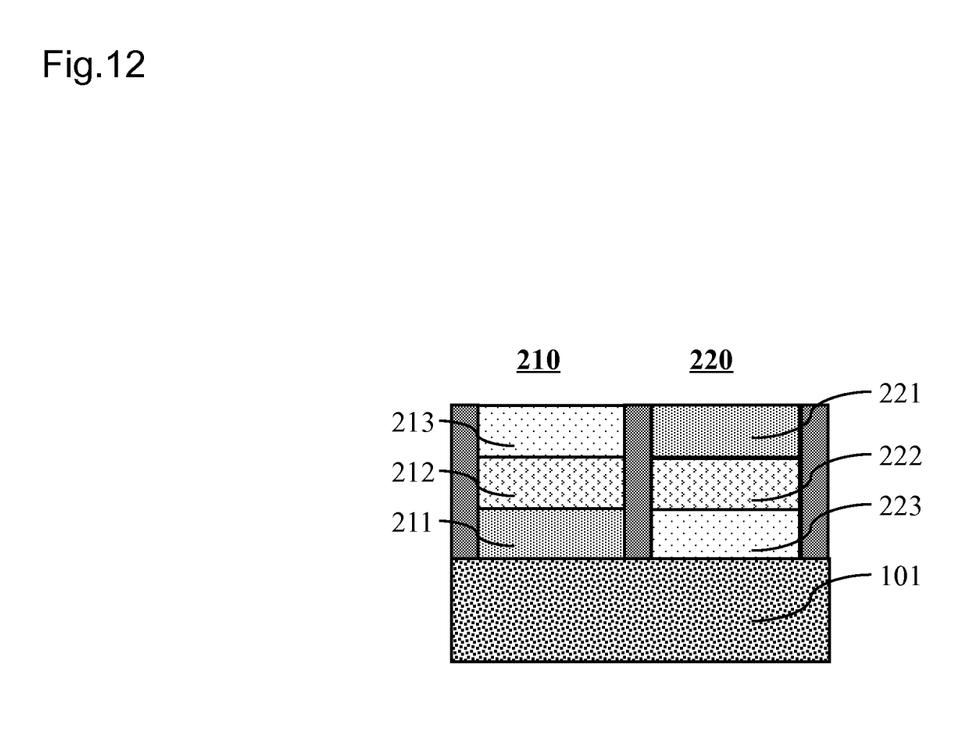

Further, provide a permanent conductive substrate 101 and transfer the first LED series A to the permanent substrate. Make the n-type layer as the light emitting surface and connect the p-type layer to the permanent substrate. See FIG. 9 for the sectional structure. The detailed processes are as follows:

Deposit a first metal bonding layer (not shown in the figure) on the p-type semiconductor layer 201 of the first LED series A through the vacuum electron beam evaporation coating. This metal bonding layer may include one or several elements of Ag, Ni, Al, Pt, Au and Ti, the total thickness of which should not be lower than 5um and the best thickness is 7 um; deposit a second metal bonding layer (not shown in the figure)

through the vacuum electron beam evaporation coating on the conductive substrate (e.g. Si or Ge). This metal bonding layer may include one or several elements of Cr, Al, Pt, Au and Ti. Bond the first metal bonding layer on the p-type semiconductor layer of the first LED series A with the second metal bonding layer of the permanent conductive substrate through the wafer bonding equipment. The second LED series B does not paste on or contact with the conductive substrate; selectively lift off the first LED series from the sapphire substrate through the 248 nmKrF gas laser and leave the second LED series on the sapphire substrate.

Further, transfer the second LED series B to the permanent substrate via the second substrate transfer and arrange the second LED series B on the permanent substrate reversal to the first LED series A. Make the p-type layer as the light emitting surface and contact the n-type layer with the permanent substrate. See FIG. 11 for the sectional structure. More particularly, firstly, paint a layer of organic glue (not shown in the figure) not less than 7 um thick (best thickness: 10 um) on the temporary substrate 102 and form an organic glue area of equal area with the second LED series B via the yellow light technology; bond this temporary substrate with the second LED series B with the die pasting and bonding method; selectively lift off the second LED series B from the sapphire substrate through the 248 nmKrF gas laser and transfer the second LED series B to the temporary substrate (see FIG. 10 for the sectional structure). Then, deposit a third metal bonding layer (not shown in the figure) on the n-type semiconductor layer of the second LED series B through the vacuum electron beam evaporation coating. This metal bonding layer may include one or several elements of Ag, Ni, Al, Pt, Au and Ti, the total thickness of which should not be lower than 5um and the best thickness is 7 urn. Bond the third metal bonding layer on the n-type semiconductor layer of the second LED series B of the temporary substrate with the second metal bonding layer on the conductive substrate with the die pasting and bonding method. Remove the temporary substrate 201 and the organic glue on the p-type semiconductor layer of the second LED series B. Both the n-type layer of the first LED series A and the p-type layer of the second LED series are exposed on the surface. Lastly, fill the gaps of the isolating area with the organic glue (organic material like BCB or SU8) in a height parallel to the epitaxial layer surface (see FIG. 11 for the sectional structure).

Further, divide the above LED series to form AC-type vertical light emitting modules, among which each light emitting module comprises an LED unit 210 of the first LED series and an LED unit 220 of the second LED series. An isolating area is formed between the two LED units.

Further, make a conductive structure in the AC-type vertical light emitting module. The detailed processes are as follows:

Deposit an ITO transparent electrode on the surfaces of the two LED units through the vacuum electron beam evaporation coating. After then, deposit a first contact bonding pad and a strip extended electrode above the organic glue of the first LED and the second LED isolating areas. This metal bonding pad and the electrode may include one or several elements of Cr, Al, Pt, Au and Ti; grind and thin the conductive substrate and form a second contact bonding pad on the back of the substrate through back metal evaporation. This back metal layer may include one or several elements of Cr, Al, Pt, Au and Ti. See FIG. 3 for the sectional structure.

In the traditional AC lateral light emitting element, a part of active light emitting area is lost due to electrical contact. In contrast, by using the vertical structure for AC LED fabrication, this invention can reduce the light emitting area loss and improve the light emitting efficiency.

Obviously, the description of the invention should not be construed as limited to only the above-described embodiments, but encompass all embodiments using the inventive concept.

The invention claimed is:

1. An AC-type vertical light emitting element, comprising:
   a conductive substrate that comprises a front main surface and a back main surface;
   an AC light emitting module having two reversely-arranged LEDs that are both formed on the same front main surface of the conductive substrate, in which, a first LED of the two reversely-arranged LEDs comprises an n-type semiconductor, an active area and a p-type semiconductor layer from top down, and a second LED of the two reversely-arranged LEDs comprises a p-type semiconductor layer, an active area and an n-type semiconductor layer from top down;
   the conductive substrate comprising a conductive structure coupling the p-type semiconductor layer of the first LED to the n-type semiconductor layer of the second LED; and
   a first bonding pad coupling the n-type semiconductor layer of the first LED to the p-type semiconductor layer of the second LED;
   wherein the AC light emitting module has a substantially continuous cross section to thereby increase a light emitting area of the first and second LEDs.

2. The AC-type vertical light emitting element according to claim 1, wherein an isolating area made of insulating material is formed between a first light emitting epitaxial layer and a second light emitting epitaxial layer, the first light emitting epitaxial layer comprising the p-type semiconductor layer, the active area and the n-type semiconductor layer of the first LED, and the second light emitting epitaxial layer comprising the p-type semiconductor layer, the active layer and the n-type semiconductor layer of the second LED, and wherein the bonding pad is arranged over the isolating area.

3. The AC-type vertical LED according to claim 1, wherein a metal contact layer is formed on the back surface of the conductive substrate.

4. The AC-type vertical light emitting element according to claim 1, wherein a strip extended electrode is distributed over a top surface of the AC light emitting module and connects to the first bonding pad.

5. The AC-type vertical light emitting element according to claim 4, wherein, under forward overlooking, the first bonding pad and the strip-extended electrode only cover 0%-5% of the active area.

6. An AC-type vertical light emitting element, comprising:
   a conductive substrate that comprise a front main surface and a back main surface;
   an AC light emitting module having two reversely-arranged LEDs that are both formed on the same front main surface of the conductive substrate, in which, a first LED of the two reversely-arranged LEDs comprises an n-type semiconductor, an active area and a p-type semiconductor layer from top down, and a second LED of the two reversely-arranged LEDs comprises a p-type semiconductor layer, an active area and an n-type semiconductor layer from top down;
   an insulating material filled between the first and second LEDs, the height of which is parallel to or a little higher than the surfaces of the two LEDs;
   a transparent conductive layer formed over the n-type layer of the first LED and the p-type layer of the second LED;

a strip-extended electrode formed over the transparent conductive layer;

the conductive substrate comprising a conductive structure coupling the p-type semiconductor layer of the first LED to the n-type semiconductor layer of the second LED;

a first bonding pad formed over the insulating material between the first and second LEDs and coupling the n-type layer of the first LED to the p-type layer of the second LED; and under forward overlooking, the first bonding pad and the strip-extended electrode only cover 0%-5% of the active area;

wherein the first and second LEDs are configured to be coupled side-by-side to an AC power supply between the first bonding pad and the conductive structure.

7. A fabrication method of the AC-type vertical light emitting element, includes the following steps:

1) providing a growth substrate, on which, forming a light emitting epitaxial layer via epitaxial growth, which at least comprises an n-type layer, an active layer and a p-type layer from bottom to top;

2) defining the size of a single LED and dividing the light emitting epitaxial layer into two LED series;

3) providing a permanent conductive substrate and transferring the first LED series to the permanent substrate, making the n-type layer as the light-emitting surface and connecting the p-type layer to the permanent substrate;

4) transferring the second LED series to the permanent substrate via second substrate transfer and making the second LED series arranged on the permanent substrate reversal to the first LED series;

making the p-type layer as the light-emitting surface and connecting the n-type layer to the permanent substrate;

5) dividing the above LED series and generating AC-type vertical light emitting modules, each comprising an LED unit of the first LED series and an LED unit of the second LED series and forming an isolating area between the two LED units;

6) forming a conductive structure in the isolating area, thus connecting the n-type layer of the first LED unit to the p-type layer of the second LED unit; and 7) forming a metal contact layer on the back of the permanent substrate to form an AC-type vertical light emitting element.

8. The fabrication method of the AC-type vertical light emitting element according to claim 7, wherein:

in the step 2) each LED unit of the first series at least has a unit of the second series adjacent to it.

9. The fabrication method of the AC-type vertical light emitting element according to claim 7, wherein:

in the step 3), the first LED series is lifted off from the growth substrate via LLO.

10. The fabrication method of the AC-type vertical light emitting element according to claim 7, wherein:

in the step 3), the permanent substrate at least comprises an LED unit of the first LED series.

11. The fabrication method of the AC-type vertical light emitting element according to claim 7, wherein:

in the step 3), the permanent substrate at least comprises two LED units of the first LED series, and the space between the two adjacent LED units is larger than the size of a single LED.

12. The fabrication method of the AC-type vertical light emitting element according to claim 7, wherein:

the step 4) includes the following steps: providing a temporary substrate and bonding the second LED series with this temporary substrate; removing the growth substrate; bonding the second LED series with the permanent substrate again; and removing the temporary substrate.

13. The AC-type vertical light emitting element according to claim 1, wherein the AC light emitting module is configured to be coupled to an AC power supply between the bonding pad and the conductive structure.

14. The AC-type vertical light emitting element according to claim 1, wherein upper surfaces of the first and second LEDs have substantively same heights.

15. The AC-type vertical light emitting element according to claim 1, wherein the AC light emitting module is formed without mesa etching.

16. The AC-type vertical light emitting element according to claim 1, wherein there is substantially no gap inside the AC light emitting module.

17. The AC-type vertical light emitting element according to claim 1, wherein the light emitting element is fabricated with the method including the following steps:

1) providing a growth substrate, on which, forming a light emitting epitaxial layer via epitaxial growth, which at least comprises an n-type layer, an active layer and a p-type layer from bottom to top;

2) defining the size of a single LED and dividing the light emitting epitaxial layer into two LED series;

3) providing a permanent conductive substrate and transferring the first LED series to the permanent substrate, making the n-type layer as the light-emitting surface and connecting the p-type layer to the permanent substrate;

4) transferring the second LED series to the permanent substrate via second substrate transfer and making the second LED series arranged on the permanent substrate reversal to the first LED series;

making the p-type layer as the light-emitting surface and connecting the n-type layer to the permanent substrate;

5) dividing the above LED series and generating AC-type vertical light emitting modules, each comprising an LED unit of the first LED series and an LED unit of the second LED series and forming an isolating area between the two LED units;

6) forming a conductive structure in the isolating area, thus connecting the n-type layer of the first LED unit to the p-type layer of the second LED unit; and 7) forming a metal contact layer on the back of the permanent substrate to form an AC-type vertical light emitting element.

18. The AC-type vertical light emitting element according to claim 6, wherein an isolating area comprising the insulating material is formed between a first light emitting epitaxial layer and a second light emitting epitaxial layer, the first light emitting epitaxial layer comprising the p-type semiconductor layer, the active area and the n-type semiconductor layer of the first LED, and the second light emitting epitaxial layer comprising the p-type semiconductor layer, the active layer and the n-type semiconductor layer of the second LED, wherein the first bonding pad is arranged over the isolating area, and wherein upper surfaces of the insulating material and the first and second LEDs have substantially same heights.

19. The AC-type vertical LED according to claim 6, wherein the AC light emitting module has a substantially continuous cross section to thereby a light emitting area of the first and second LEDs.

20. The AC-type vertical LED according to claim 6, wherein the AC light emitting module is formed without mesa etching such that there is substantially no gap inside the AC light emitting module.

* * * * *